United States Patent [19]

O'Bryan, Jr. et al.

[11] Patent Number: 5,006,504
[45] Date of Patent: Apr. 9, 1991

[54] PREPARING SUPERCONDUCTING CERAMIC MATERIALS

[75] Inventors: Henry M. O'Bryan, Jr., Plainfield; Warren W. Rhodes, Raritan; John Thomson, Jr., Spring Lake, all of N.J.

[73] Assignee: AT&T Bell Laboratories, Murray Hill, N.J.

[21] Appl. No.: 399,649

[22] Filed: Aug. 28, 1989

[51] Int. Cl.$^5$ .................. H01L 39/12; C04B 35/64
[52] U.S. Cl. .................................. 505/1; 264/63; 264/66; 505/739; 505/780
[58] Field of Search .................. 264/12, 66; 505/739, 505/780, 733, 1, 725, 809

[56] References Cited

U.S. PATENT DOCUMENTS

| | | | |
|---|---|---|---|
| 4,297,250 | 10/1981 | Gupta et al. | 264/66 X |
| 4,663,105 | 5/1987 | Sakai et al. | 264/66 |
| 4,740,288 | 4/1988 | Yamada | 204/424 X |
| 4,804,649 | 2/1989 | Sherif | 505/1 |
| 4,810,339 | 3/1989 | Heavens et al. | 204/180.1 |
| 4,824,826 | 4/1989 | Damento et al. | 505/1 |

OTHER PUBLICATIONS

Johnson et al., "Fabrication . . . Oxides", *High Temperature Superconductors*, (1987).
"Annealing Effects on Properties of High T$_c$ YBa$_2$Cu$_3$O$_{7-x}$ Ceramics", bs Shyu et al., Mat. Res. Soc. Symp. Proc., vol. 99 (1988).
"Processing High Density Fine-Grained Ba$_2$YCu$_3$O$_7$ Superconductors", *Journal of Superconductivity*, vol. 1, #2 (1988).
"Fabrication of YBa$_2$Cu$_3$O$_7$ Superconducting Ceramics," by Poeppel et al., *American Chemical Society* (1987), ch. 24.
"Superconductivity at Accessible Temperatures" by Edward M. Engler, *Chemtech*, Sep. 1987.
"Annealing Treatment Effects on Structure and Superconductivity in Y$_1$Ba$_2$Cu$_3$O$_{9-x}$", by Beyers et al., App. Phys. Lett., 51, Aug. 24, 1987.
Poeppel et al., "Fabrication of YBa$_2$Cu$_3$O$_7$ Superconducting Ceramics", 1987 American Chemical Society, Chapter 24.
P. M. Grant et al., "Superconductivity above 90 K in the Compound YBa$_2$Cu$_3$O$_x$: Structural, Transport, and Magnetic Properties", Rapid Communications Physical Review B, vol. 35, No. 13, May 1, 1987.
R. Beyers et al., "Annealing Treatment Effects on Structure and Superconductivity in Y$_1$Ba$_2$Cu$_3$O$_{9-x}$", Appl. Phys. Lett. 51, Aug. 24, 1987.
J. S. Wallace et al., "Processing High-Density, Fine--Grained Ba$_2$YCu$_3$O$_7$ Superconductors", Journal of Superconductivity #2, vol. 1, 1988.
Edward M. Engler, "Superconductivity at Accessible Temperatures", Chemtech, Sep., 1987.

*Primary Examiner*—James Lowe
*Assistant Examiner*—Christopher A. Fiorilla
*Attorney, Agent, or Firm*—Oleg E. Alber

[57] ABSTRACT

A process for the preparation of superconducting ceramic materials by a solid state reaction technique. The process is especially suited for production of powders including $\geq 95\%$ of Ba$_2$YCu$_3$O$_7$ for use in producing sintered ceramic bodies including $>99\%$ Ba$_2$YCu$_3$O$_7$. The process includes the steps of (a) wet milling raw powders of starting ingredients, including oxides and/or carbonates or the respective ions, to form a milled slurry, (b) separating particulate solids from the liquids of the slurry, the separating including continuously agitating the mixed slurry so as to avoid segregation of the milled ingredients and spray drying the milled slurry to produce spray dryed particles, (c) calcining the separated particles in oxygen to form calcined powder, (d) optionally remilling the calcined powder, (e) forming the calcined powder into a suitable form body and (f) sintering the formed body in oxygen; preferably said separating step including spray drying the agitated, milled slurry. The above process results in calcined material including $\geq 95\%$ of a single phase material (Ba$_2$YCu$_3$O$_7$) and a small amount e.g. 3%, of a single second phase material and leads to a sintered ceramic which is $\geq 99\%$ single phase material.

5 Claims, 2 Drawing Sheets

PREPARING SUPERCONDUCTING CERAMIC MATERIALS

FIELD OF THE INVENTION

The present invention is concerned with the preparation of superconducting ceramic materials by a solid state reaction technique.

BACKGROUND OF THE INVENTION

Diverse industrial applications are being sought by scientists and engineers for ceramic materials which exhibit superconducting properties (conduct electrically with no resistance) at relatively high superconductive transition temperatures, $T_c$, such as above the boiling point of liquid nitrogen (77K). Ceramic materials synthesized from yttrium, barium and copper oxides in 1:2:3 molar ratio, such as $YBa_2Cu_3O_x$ (also known as $Ba_2YCu_3O_x$) material with x being from 6 to 7, exhibit relatively high superconductive transition temperature, $T_c$. For example, see P. M. Grant et al., "Superconductivity above 90K in the compound $YBa_2Cu_3O_x$: Structural, transport and magnetic properties." *Physical Review B*, Vol 35, No. 13, May 1, 1987, pp. 7242–7244. Among these, $YBa_2Cu_3O_7$, a perovskite superconductor which can have $T_c$ of 90K is deemed the most likely composition to achieve industrial application.

A solid state reaction process suitable for forming $YBa_2Cu_3O_7$ containing powders on a relatively large scale is described by R. B. Poeppel et al. in "Fabrication of $YBa_2Cu_3O_7$ Superconducting Ceramics", Chemistry of High-Temperature Superconductors, D. L. Nelson, M. S. Whittingham and T. F. George, eds., American Chemical Society, Washington, D.C., 1987, pp. 261-265. The published process comprises wet milling raw powders of $BaCO_3$, $Y_2O_3$ and $CuO_x$, evaporating excess fluid after the milling step, and calcining the resultant milled raw powder. The calcining is conducted in one of two variants: (a) a long-term precalcine of raw powder at 850° C. for a period of 24 h, followed by lightly grinding, quick heat-up (in about 15 min.) to 950° C. and final-calcining at 950° C. for about 2 hrs., or (b) heating the raw powders at 950° C. for 2-6 h, cooling, regrinding and repeating this procedure for three calcinations. The calcined powder is dry pressed with the addition of suitable binders into a desired green form, e.g. disk, tape, wire, etc., which is sintered by preheating to above 850° C., heating at 975° C. and cooling. Unfortunately, such a process of preparing calcined powders has at least the following disadvantages:

(1) The step of evaporating excess fluid from the milled slurry may lead to segregation of component particles through disproportionate sedimentation of components with higher densities, especially if these components are present as relatively large agglomerates (relative to the size of the individual particles). This may lead to formation of several other phases in addition to $Ba_2YCu_3O_7$ as well as formation of $BaCO_3$—$CuO$ eutectic.

(2) The calcining process includes multiple calcining with intermediate granulation. Multiple calcining and intermediate grinding are time and effort consuming and often add impurities. Some of the calcining is conducted at temperatures, e.g. 950° C., which are conducive to production of larger particles and melting resulting in formation of hard aggregates which may be granulated with difficulty, if at all.

Subsequent steps of remilling, recalcining, granulating and sintering often do not homogenize these powders sufficiently to result in sintered bodies of substantially homogeneous, essentially single phase material on a consistently reproducible basis.

An attempt by the present inventors to produce powders utilizing the process of R. B. Poeppel et al., but with a sequence of filtering, drying and granulating steps (hereinafter being referred to as "filter-drying") in place of the evaporating step led to powders having several other phases in addition to $Ba_2YCu_3O_7$. Batches of mixed raw materials processed by filter-drying did not calcine into $\geq 95\%$ single phase powder. It was concluded that the process including the filter-drying of wet milled slurry cannot yield powders with a sharp superconducting transition. Thus, it is still desirable to design a simple, easily controllable and efficient process for producing powders of substantially homogeneous, $\geq 95\%$ single phase $Ba_2YCu_3O_7$ which could consistently result, upon sintering, in bodies of substantially single phase material.

SUMMARY OF THE INVENTION

This invention is concerned with a process of producing, by solid state reaction technique, powders comprising $Ba_2YCu_3O_x$, with x being from 6 to 7. The process includes wet milling of raw powders of starting ingredients, including oxides and/or carbonates, such as $BaCO_3$, $Y_2O_3$ and $CuO$, removal of the liquid from the slurry and prereacting (calcining) of resultant solids in oxygen atmosphere. Removal of the liquid from the wet milled slurry without permitting segregation of solid components each from another prior to a calcining step is accomplished by continuously agitating wet milled slurry to prevent segregation of solids each from another prior to and during the removal of the liquid from the solid portion of the slurry. An easy, rapid and convenient way to remove the liquid from the slurry and to, simultaneously, produce dry powder comprising the mixed components is by spray drying. Calcination temperature and time at temperature may be selected to be high enough and long enough to decompose the $BaCO_3$. Calcined powders prepared by this method are $\geq 95\%$ single phase $Ba_2YCu_3O_7$, have an average particle size $< 10$ $\mu$m and can be sintered into ceramics with nearly 99% single phase and with $T_c$ (onset) $\geq 90K$ and a $T_c$ (midpoint) $> 88$ when measured by a.c. susceptibility.

DETAILED DESCRIPTION

Figure 1:
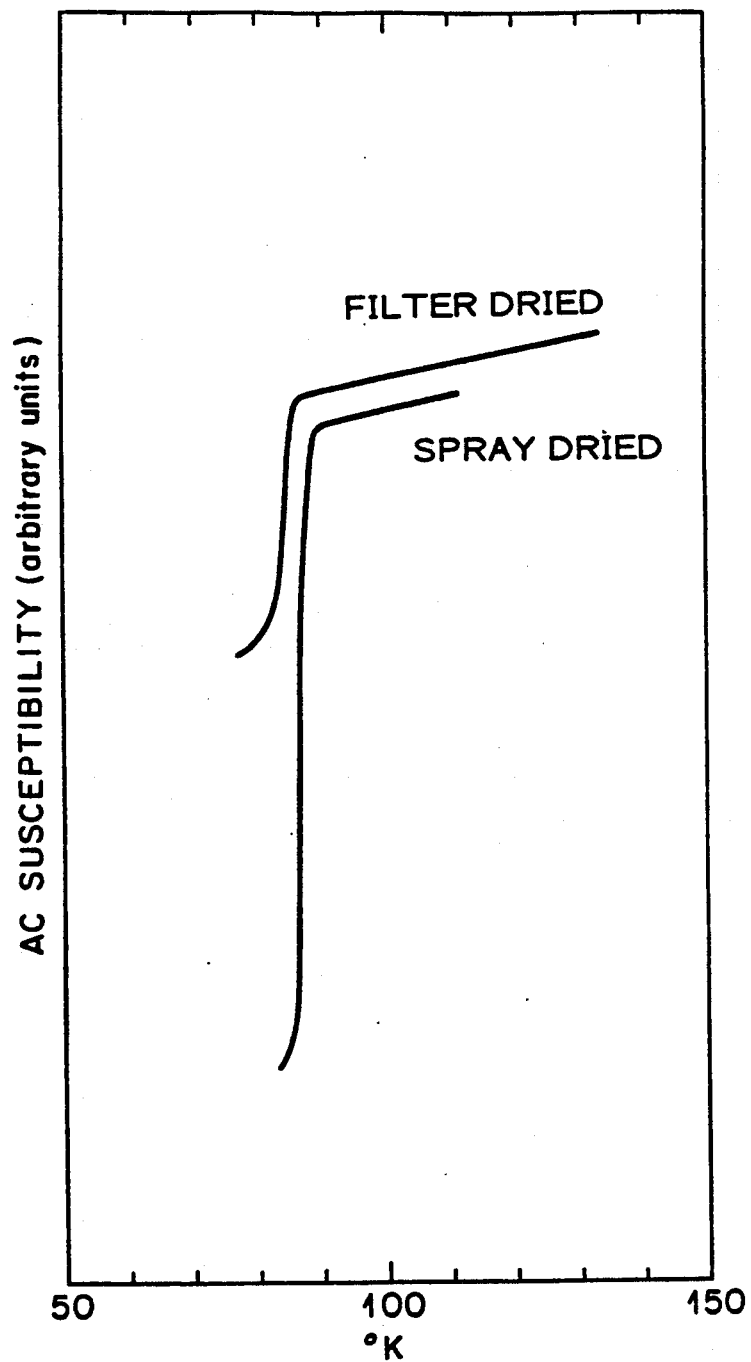
FIG. 1 shows $T_c$ behavior of sintered ceramic prepared from filter-dired and spray dryed prereacted powders.

The present invention is a process for fabricating sintered ceramic bodies having superconducting characteristics and is concerned especially with production of substantially homogeneous powder for use in sintering into the ceramic bodies. The process is illustrated with reference to the production of superconducting bodies containing essentially single phase $Ba_2YCu_3O_7$ material. The principles of the invention are applicable with logical modifications to the production of other multicomponent superconducting materials.

The need for this invention arose due to a desire to produce on an industrial scale substantially homogeneous, essentially single phase material comprising a multi-component superconducting material such as $Ba_2YCu_3O_7$. An attempt to prepare bodies of substantially homogeneous, essentially single phase $Ba_2YCu_3O_7$ utilizing the procedure described in the above-mentioned article by R. B. Poeppel et al. and modified by replacing the step of evaporating the liquid from the milled slurry with a sequence of steps including filtering the milled slurry to remove the liquid from the solids, drying the wet solids and granulating the resultant cake prior to a calcining step, led to a calcined powder having non-homogeneous, multi-phase composition. Subsequent steps of milling, granulating and sintering failed to produce sintered bodies of a substantially homogeneous, essentially single phase material on a reproducible basis.

The inventors have observed that the filtering step produced a layered cake and that some of the layers included predominantly one ingredient, e.g. the top layer included mostly $BaCO_3$ while the bottom layer included mostly CuO. Whenever the liquid was removed from the milled slurry by steps permitting stagnation of the slurry, such as filtration (or evaporation of the liquid or settling of the solids with decantation of the liquid); the solids in the resultant cake became separated into several layers, some of which included predominantly one ingredient. Upon calcining, this segregation led to a highly non-homogeneous composition, which was not completely homogenized in the subsequent treatment (e.g. milling, granulating and sintering). They realized that this segregation into layers occurred due to different solid densities and, thus, different settling rates of the respective component powders. The segregation was aggravated by agglomeration of components with greater densities, especially $CuO_x$, into agglomerates which were relatively large compared with the original size of the initial particles.

These shortcomings were avoided in accordance with the present invention by continuously agitating the milled slurry prior to and during the removal of liquid from the solids in the slurry. This permits removal of the liquid from the wet milled slurry without permitting segregation of solids each from another. An easy, rapid and convenient way to simultaneously remove the liquid from the agitated slurry and to produce dry powder comprising of the mixed components is by spray drying the milled slurry. The difference in bulk density of a spray dried powder vs. filter-dried powder was not significant (i.e. $\sim 1.36$ g/cm$^3$ for each). However, surprisingly, the spray dried powder resulted in highly homogeneous calcined composite with $\geq 95\%$ single phase material, the remainder being mostly a single second phase material. Subsequent sintering of this material consistently resulted in compositions with about 99% or more of the single phase material.

Preparation of $YBa_2Cu_3O_7$ ceramic powder involves the mixing of batches of raw materials, such as pure oxides and/or carbonates (e.g. copper oxide, yttrium oxide, and barium carbonate or hydrated barium hydroxide) in proper proportions. For a primary batch of 3000 grams, 455 g $Y_2O_3$, 1579 g $BaCO_3$ and 959 g of CuO may be included in a single lot. The primary batches may be prepared with about 0.5% deficiency of CuO.

Raw powders are commercially available from various sources. For example, 15 $\mu$m particles of $Y_2O_3$ were available with 99.99% (REO) purity from ALFA Products of Morton Thiokol, Inc., 0.65 $\mu$m particles of $BaCO_3$ were available with 99.8% (Label) purity from Fisher Scientific and 0.31 $\mu$m and 1 $\mu$m particles of CuO were available with 99.60% (ACS) purity from ALFA Products of Morton Thiokol, Inc. Raw powders with smaller particles in the initial ingredients are preferable since this permits lower calcining temperatures. This is especially true in the case of CuO. Of the three raw powder compositions, CuO was found to include large agglomerates, e.g. $\sim 5$ $\mu$m and $\sim 50$–100 $\mu$m, for the respective sizes of 0.31 $\mu$m and 1 $\mu$m.

The proportioned raw materials were initially dry blended by tumbling until an overall uniformity in appearance was achieved. Mixing continued on a ball mill using a 3.8 L (one U.S. gallon) polypropylene jar, half filled with zirconia grinding media. Milling operation at 50 to 100 RPM would be also suitable. The contents of the jar included 1200 ml. demineralized deionized (DDI) water, along with a dilute solution, e.g. 1 wt. %, of each of a binder, a defoaming agent, and a dispersant. Binders may be selected from acrylic polymers, acrylic polymer emulsions, ethylene oxide polymer, hydroxyethyl cellulose, methyl cellulose, polyvinyl alcohol, TRIS isocyanide and wax lubricants. The preferred binder is polyvinyl alcohol. Defoaming agents may be selected from non-ionic octyl phenoxyethanol or 2-octonol, with octonol being the preferred agent. Dispersants suitable for use with aqueous solutions may be selected from complex glassy phosphates, condensed aryl sulfonic acids, and ammonium deflocculants. The preferred dispersant is Darvan 821A ®, an ammonium polyacrylate commercially available from R. T. Vanderbilt, Norwalk, Conn., U.S.A.

The primary function of this milling procedure is to serve as a mixing and comminuting operation to promote the reactivity of the raw materials during calcination. This milling operation was performed at about 70 RPM for approximately 16 hours. Upon completion of the milling, the slurry was spray dried. Special attention was taken to insure that the milled slurry remains homogeneous prior to and during the spray drying. This is accomplished by continuously agitating the slurry prior to and during the spray drying to prevent segregation of solids each from another caused by different sedimentation rates of the solid components. This agitation was found to be extremely important. The temperature of the spray dryer was held within the range of 240° to 260° C., the air pressure was maintained at about 82.7 KPa (12 pounds) on a two-fluid atomizing nozzle, and the rate at which the slurry was fed into the spray dryer was approximately 100 cc/min. via a peristaltic pump which was regulated between 100 and 200 rpm.

The spray drying operation simultaneously removes the water from the wet milled slurry and yields powder agglomerates with $\sim 100$ $\mu$m diameter. To remove any large agglomerates that may have come loose from the walls of the spray drying equipment during the drying operation, coarser spray dried particles were screened through a 177 micrometer (80 mesh) screen while finer powders were put through a 88 micrometer (170 mesh) screen. Before calcination the screened fine and coarse powders were homogeneously dry blended by tumbling.

Spray dried powder underwent calcination in an oxygen atmosphere according to a following typical schedule: ramp to 900° C. in 4 hours, soak at 900° C. for 24 hours, and ramp to room temperature (about 20° C.) in 1 hour. The resultant powder calcined in accordance with the above schedule was well reacted with small particles. Longer times at moderate temperatures had the effect of maintaining particle size while promoting reaction. For a typical batch, the effect of time on reaction is about 20% second phase after 6 h at 900° C. and <5% second phase after 24 hr. While other soaking temperatures up to about 940° C. may be selected, high calcining temperature should be avoided. Typically, higher temperature produces larger particles which are more completely reacted; however, higher soaking temperatures, e.g. 950° C., may result in hard aggregates which are granulated with great difficulty, if at all.

The calcined powder after being granulated e.g. through a 841 micrometer (20 mesh) screen, may, optionally, be subjected to a second milling operation for purposes of particle size reduction. For this operation, a 1.9 L (½ U.S. gallon) polypropylene jar half filled with zirconia grinding media is utilized. Water was not used as a milling vehicle because its reaction with $YBa_2Cu_3O_7$ powder causes decomposition. Instead, the jar was filled with about 600 ml of iso-propyl alcohol. The jar was rotated at 100 rpm during this milling operation. The length of the second milling operation was selected to yield an average particle size of five to ten micrometers. Typically milling for a period of about 5 to 8 hours (h) yields an average particle size of from six to eight micrometers. Milling for longer times while leading to a yet smaller particle size, e.g. 4 $\mu$m, introduces a small amount of $ZrO_2$ from the milling media which appears as a $BaZrO_3$ impurity in the sintered ceramics.

Upon completion of the second milling operation, the slurry was filtered to remove the alcohol and then dried to obtain the finished powder. In general, most batches were filtered overnight for convenience (since no attendant is needed) and because of the very slow rate of alcohol removal. Once the liquid had been removed, the resultant filter cake was placed in a drying oven for 4 hours at 110° C. Since the calcine yielded single phase powder, no segregation could occur during this filtration and powder homogensity is maintained. Thereafter, the dried material was granulated through a 420 micrometer (40 mesh) screen.

Sintered properties were determined by preparing discs of granulated powder 1.9 cm (three-quarter inch) in diameter. The discs were pressed at about 6.9 MPa (1000 psi) using a Carver press and sintered in oxygen atmosphere according to the following firing schedule: Ramp to 900° C. in 2 hours, ramp to 975° C. in 6 hours, soak at 975° C. for 6 hours, ramp to 450° C. in 1 hour, soak at 450° C. for 4 hours, and ramp to room temperature in 1 hour. Other sintering schedules may be devised by those with an average skill in the art.

For comparison purposes, similar batches of raw powders (3000 g) were prepared by filter drying. In this process, upon completion of wet milling of raw powders, the slurry was filtered, dried and granulated (filter-dried). The filtration operation consisted of pouring out the milled slurry onto Whatman #50 filter paper held in a 33 cm. (13 inch) diameter Buchner funnel. The powder settled from the slurry within 5 minutes, but the passage of water through the filter cake was very slow (3 h). The filter cake was oven dried at 110° C. Visually, the filter cake appeared heterogeneous with black glaze at the top, followed by dark gray and light gray intermediate regions and a dark gray region at the bottom. There had been a pronounced segregation in the filter cake, with $BaCO_3$ concentrating at the top and $Y_2O_3$ and CuO toward the bottom.

Before granulation, some pieces of filter cake were removed and sectioned. The sectioned portions of the filter cake were calcined (prereacted) under conditions similar to the spray dried material. The remainder of the dried filter cake, after granulation, through a 841 micrometer (20 mesh) sieve, was calcined in oxygen in the manner identical to the spray dried material and optionally subjected to a second milling operation. Sintered ceramic samples were obtained by sintering discs of the calcined (prereacted) powders under conditions similar to those for the spray dried material (soaking at 975° C. for 6 h in oxygen followed by an anneal at 450° C. for 4 h in oxygen).

The sintered discs, prepared from spray dried and filter-dried based powders, were evaluated to determine a.c. susceptibility and phase content.

Measurements of a.c. susceptibility were taken on all sintered materials. Samples that showed a large degree of second phase content (filter-dried material) after calcination had a much larger $\Delta T$ region. Sintered samples of spray dried powders showed a very sharp transition with a $T_c$ (onset) of 90.5K and a $T_c$ (midpoint) of 89K. Sintered samples prepared from filter-dried powders showed a less sharp transition with a $T_c$ (onset) of 89K and $T_c$ (midpoint) of 85.5K. FIG. 1 compares the $T_c$ (onset) and transition width for ceramics prepared from spray-dried and filter-dried powders as indicated by a.c. susceptibility measurement. Broadening of the transition as well as a lower $T_c$ are observed for the filter-dried powders.

Figure 2:
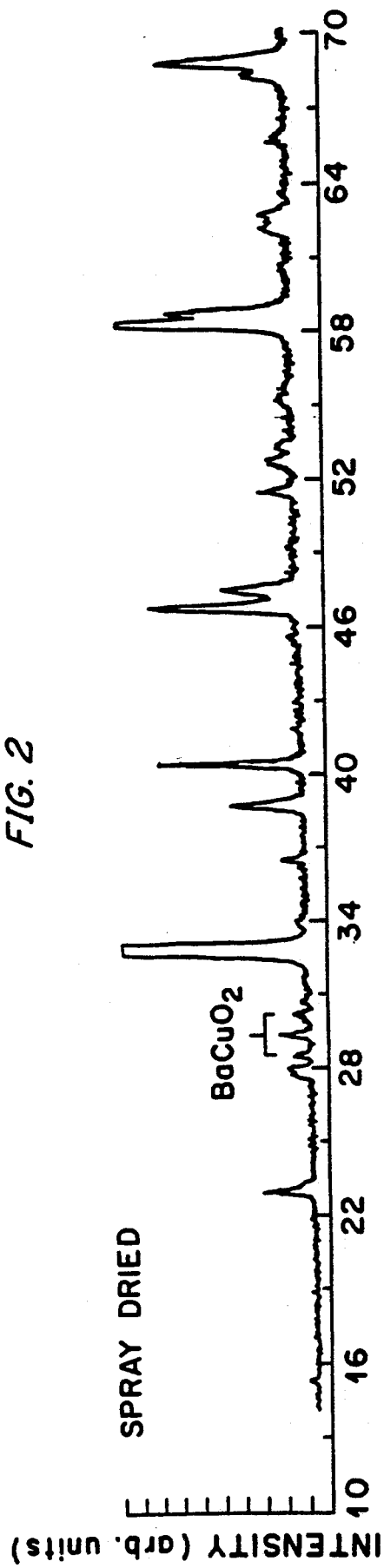
FIG. 2 shows X-ray patterns of powders prepared from raw materials which were spray-dried and prereacted at 900° C. for 24 hours in oxygen.
Figure 3:
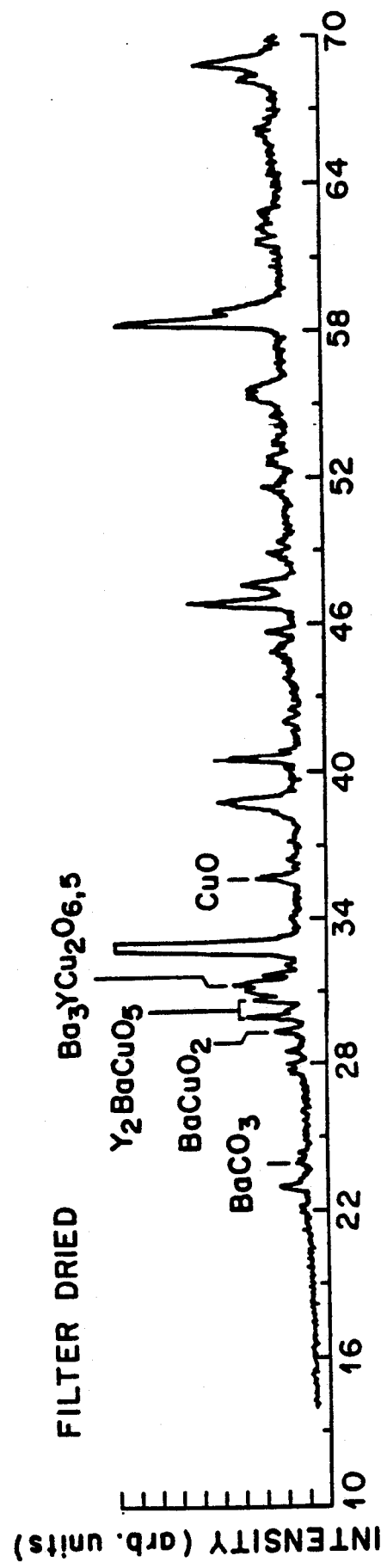
FIG. 3 shows the X-ray patterns of powders prepared from raw materials which were filter-dried and prereacted at 900° C. for 24 hours in oxygen.

X-ray diffraction techniques were used to determine phase content. X-ray analyses were performed on the spray dried and filter-dried powders before and after calcining (prereaction). Also, sections of filter cake were examined before and after calcining (prereaction). Table I summarizes the characteristics of the calcined powder lots and corresponding sintered ceramics. Table II summarizes X-ray diffraction data from various sections and reveals compositional differences for both unreacted and prereacted material. X-ray analysis reveals that smaller percentages of second phase are present in sintered ceramics prepared from the spray dried raw powders as compared to those prepared from the filter-dried powders, with sintered material prepared from spray dried powders showing a total second phase content of less than two percent. FIGS. 2 and 3 compare the x-ray patterns of calcined (prereacted) powders produced from spray dried and filter-dried raw powders, respectively. The amount of phase in the calcined (prereacted) or sintered samples is estimated by the intensity of the major peak of the second phase relative to the (110/013) peak of $Ba_2YCu_3O_x$. The spray dried calcined powder is >95% single phase with ~3% $BaCuO_2$ as the major second phase. In addition, the peak at 2 $\theta$=32.9° (d~2.73 Angstrom) can be resolved into the (103) and (110/013) peaks. The filter-dried calcined powder, made with the same raw materials, contains phases such as $BaCuO_2$, $BaCO_3$, $Y_2BaCuO_5$, $Ba_3YCu_2O_x$ and CuO, and its 32.9° peak cannot be resolved. The inability of filter-dried powder to become homogeneous during prolonged prereaction and sintering at 975° C. is due to the initial non-homogeneity of the filter-dried powders. Higher calcine temperature, e.g. 910° C., did not suppress the formation of second phases in the filter-dried materials.

TABLE I

Properties of Powders and Ceramics Relative Peak Height By X-Ray

| Phase | Peak Dried % | Filter Dried % |
|---|---|---|
| Calcined 900°/24 h | | |
| $BaCuO_2$ | 3 | 6 |
| $BaCO_3$ | — | 6 |
| $Y_2BaCuO_5$ | — | 13 |
| $Ba_3YCu_2O_x$ | — | 15 |
| CuO | — | 10 |
| Sintered 975°/6 h 450°/4 h | | |
| $Y_2BaCuO_5$ | — | 2 |
| $BaCuO_2$ | — | — |

TABLE II

Phase Amounts in Unreacted and Prereacted Powder from Mixed Raw Materials

| | Unreacted (normalized to 100 for $BaCO_3$) | | |
|---|---|---|---|
| | $Y_2O_3$ | CuO | $BaCO_3$ |
| Spray dried Filter Cake | 44* | 23 | 100 |
| Top (glaze) | 19 | 20 | 100 |
| 2nd (dark) | 23 | 14 | 100 |
| 3rd (light) | 25 | 44 | 100 |
| 4th (dark) | 170 | 260 | 100 |
| granulated | 44 | 30 | 100 |

| | Prereacted 900° C./24 h/$O_2$ (normalized to 100 for phase of highest concentration) | | | | |
|---|---|---|---|---|---|
| | $BaCuO_2$ | $Ba_2YCu_2O_x$ | CuO | $Y_2BaCuO_5$ | $Ba_2YCu_3O_x$ |
| Spray dried Filter cake | 3 | — | — | — | 100 |
| Top | 20 | 100 | — | — | 50 |
| Bottom | — | — | 100 | 50 | 35 |
| Granulated | 13 | 84 | 52 | 66 | 100 |

*Relative intensity of major peak.

It is to be understood that the above described embodiments are simply illustrative of the principles of the invention. Various other modifications and changes may be devised by those of average skill in the art, which will embody the principles of the invention and fall within the scope and spirit thereof.

What is claimed is:

1. The process of fabricating superconducting ceramic bodies comprising >99 percent $YBa_2Cu_3O_7$, which comprises the steps of
   (a) wet milling an aqueous slurry comprising selected proportions of starting ingredients comprising yttrium oxide, barium carbonate and cupric oxide in an approximately 1:2:3 molar ratio to form a milled slurry, said aqueous slurry including a binder, a defoaming agent and a dispersant,
   (b) continuously agitating the milled slurry after the wet milling step so as to avoid non-uniform sedimentation of starting ingredients in the slurry,
   (c) spray drying the milled slurry into particulate material,
   (d) calcining the spray dried particulate material to produce a calcined powder, said calcining step comprising ramping the temperature within a calcining furnace containing the spray dried particulate material to 900° C. in 4 hours, soaking the particulate matter at 900° C. for a period of 24 hours and, thereafter, ramping the temperature to about 450° C. in about 4 hours, the calcined powder comprising $\geq 95$ percent $YBa_2Cu_3O_7$,
   (e) forming the calcined powder into a body having a desired form, and
   (f) sintering said body, said sintering including the steps comprising ramping the temperature of a sintering furnace to 900° C. in 2 hours, ramping the temperature from 900° to 975° C. in 6 hours, soaking the body at 975° C. for 6 hours, ramping the temperature from 975° C. to 450° C. in 1 hour, soaking the body at 450° C. for 4 hours, and ramping the temperature from 450° C. to room temperature in 1 hour.

2. The process of claim 1 in which said aqueous slurry includes 1 wt. % solution of polyvinyl alcohol as a binder, octonol as the defoaming agent and ammonium polyacrylate as the dispersant.

3. The process of claim 1 in which the amount of cupric oxide in the starting ingredients is reduced by 0.5%.

4. The process of claim 1 in which prior to said body forming step, said calcined powder is subjected to an additional milling operation using a non-aqueous milling media.

5. The process of claim 4 in which said additional milling is conducted for a period of time sufficient to reduce an average particle size to a size ranging from 5 to 10 μm.

* * * * *